(12) United States Patent
Gao et al.

(10) Patent No.: US 10,615,551 B2
(45) Date of Patent: *Apr. 7, 2020

(54) SIMPLIFIED CONNECTOR RECEPTACLE HOUSINGS

(71) Applicant: Apple Inc., Cupertino, CA (US)

(72) Inventors: Zheng Gao, Sunnyvale, CA (US); Steve McClure, San Francisco, CA (US); Joshua Banko, Palo Alto, CA (US); Greg Springer, Los Altos, CA (US); Min Chul Kim, Santa Clara, CA (US); Joshua Funamura, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/180,945

(22) Filed: Nov. 5, 2018

(65) Prior Publication Data

US 2019/0109421 A1  Apr. 11, 2019

Related U.S. Application Data

(60) Continuation of application No. 15/396,651, filed on Dec. 31, 2016, now Pat. No. 10,122,132, which is a
(Continued)

(51) Int. Cl.
*H01R 13/648* (2006.01)
*H01R 24/60* (2011.01)
(Continued)

(52) U.S. Cl.
CPC ............. *H01R 24/60* (2013.01); *H01R 13/03* (2013.01); *H01R 13/6271* (2013.01);
(Continued)

(58) Field of Classification Search
CPC . H01R 12/00; H01R 13/6587; H01R 13/6594
(Continued)

(56) References Cited

U.S. PATENT DOCUMENTS

| 4,115,665 A | 9/1978 | Giacoppo et al. |
|---|---|---|
| 4,509,811 A | 4/1985 | Amano et al. |

(Continued)

*Primary Examiner* — Phuong K Dinh
(74) *Attorney, Agent, or Firm* — Kilpatrick Townsend & Stockton, LLP

(57) ABSTRACT

Structures, methods, and apparatus that provide connector receptacles that have a reduced tendency to scratch and otherwise mar connector inserts, have an aesthetically-pleasing appearance, and have an improved tactile response when inserts are inserted. Various examples reduce scratches and wear by utilizing domes, cylinders, balls, or other structures as finger contacts in a connector receptacle. Another example provides aesthetically-pleasing connector receptacle enclosures by forming receptacle enclosures using the same type of material, or material having the same or similar color or texture, as is used for enclosing the electronic device that includes the receptacle. Another example provides an aesthetically-pleasing receptacle enclosure by forming receptacle enclosures that are, in part or in whole, contiguous or formed with the housing. Another embodiment provides a connector receptacle having a housing where a portion of the housing has been removed to save space.

19 Claims, 18 Drawing Sheets

Related U.S. Application Data continuation of application No. 14/463,580, filed on Aug. 19, 2014, now Pat. No. 9,548,577, which is a continuation of application No. 12/895,183, filed on Sep. 30, 2010, now Pat. No. 8,808,030, which is a continuation-in-part of application No. 12/854,180, filed on Aug. 11, 2010, now Pat. No. 8,162,688, which is a division of application No. 12/571,376, filed on Sep. 30, 2009, now Pat. No. 7,794,263.

(51) Int. Cl.
*H01R 13/627* (2006.01)
*H01R 13/6582* (2011.01)
*H01R 13/74* (2006.01)
*H01R 13/03* (2006.01)
*H05K 5/02* (2006.01)
*H01R 12/72* (2011.01)
*H01R 13/506* (2006.01)
*H01R 107/00* (2006.01)

(52) U.S. Cl.
CPC ..... *H01R 13/6276* (2013.01); *H01R 13/6582* (2013.01); *H01R 13/741* (2013.01); *H05K 5/0247* (2013.01); *H01R 12/725* (2013.01); *H01R 13/506* (2013.01); *H01R 2107/00* (2013.01); *H01R 2201/06* (2013.01); *Y10T 29/49208* (2015.01)

(58) Field of Classification Search
USPC ........ 439/607.4, 660, 607.35, 656, 939, 564
See application file for complete search history.

(56) References Cited

U.S. PATENT DOCUMENTS

| | | |
|---|---|---|
| 4,558,270 A | 12/1985 | Liautaud |
| 4,954,097 A | 9/1990 | Sekiguchi |
| 5,017,156 A | 5/1991 | Sugiyama |
| 5,065,082 A | 11/1991 | Fushiya |
| 5,139,439 A | 8/1992 | Shie |
| 5,637,014 A | 6/1997 | Sukegawa et al. |
| 5,718,605 A | 2/1998 | Morikawa et al. |
| 5,754,397 A | 5/1998 | Howell et al. |
| 5,980,325 A | 11/1999 | Horchler |
| 6,146,182 A | 11/2000 | Wang et al. |
| 6,193,552 B1 | 2/2001 | Chiou et al. |
| 6,203,353 B1 | 3/2001 | Huang et al. |
| 6,264,504 B1 | 7/2001 | Wu |
| 6,386,908 B2 | 5/2002 | Kato et al. |
| 6,508,676 B1 | 1/2003 | Xu |
| 6,558,202 B1 | 5/2003 | Hahn |
| 6,659,799 B2 | 12/2003 | Yang |
| 6,986,681 B2 | 1/2006 | Tsai |
| 7,330,923 B2 | 2/2008 | Wenstrand et al. |
| 7,357,648 B2 | 4/2008 | Merz |
| 7,371,116 B2 | 5/2008 | Chiang |
| 7,467,977 B1 | 12/2008 | Yi et al. |
| 7,628,658 B1 | 12/2009 | Chiang |
| 7,645,165 B2 | 1/2010 | Wu et al. |
| 7,794,263 B1 | 9/2010 | Kim et al. |
| 7,901,249 B1 | 3/2011 | Chen |
| 7,909,643 B2 | 3/2011 | Pepe et al. |
| 8,162,688 B2 | 4/2012 | Kim et al. |
| 8,337,253 B2 | 12/2012 | Gao et al. |
| 8,506,327 B2 | 8/2013 | Jol |
| 8,597,044 B2 | 12/2013 | Kim et al. |
| 8,628,346 B2 | 1/2014 | Gao et al. |
| 8,808,030 B2 | 8/2014 | Gao et al. |
| 9,548,577 B2 | 1/2017 | Gao |
| 10,122,132 B2 * | 11/2018 | Gao ............... H01R 13/6271 |
| 2004/0203267 A1 | 10/2004 | Chen |
| 2007/0247803 A1 | 10/2007 | Eickholdt |
| 2008/0204992 A1 | 8/2008 | Swenson et al. |
| 2012/0158516 A1 | 6/2012 | Wooten, III |

* cited by examiner

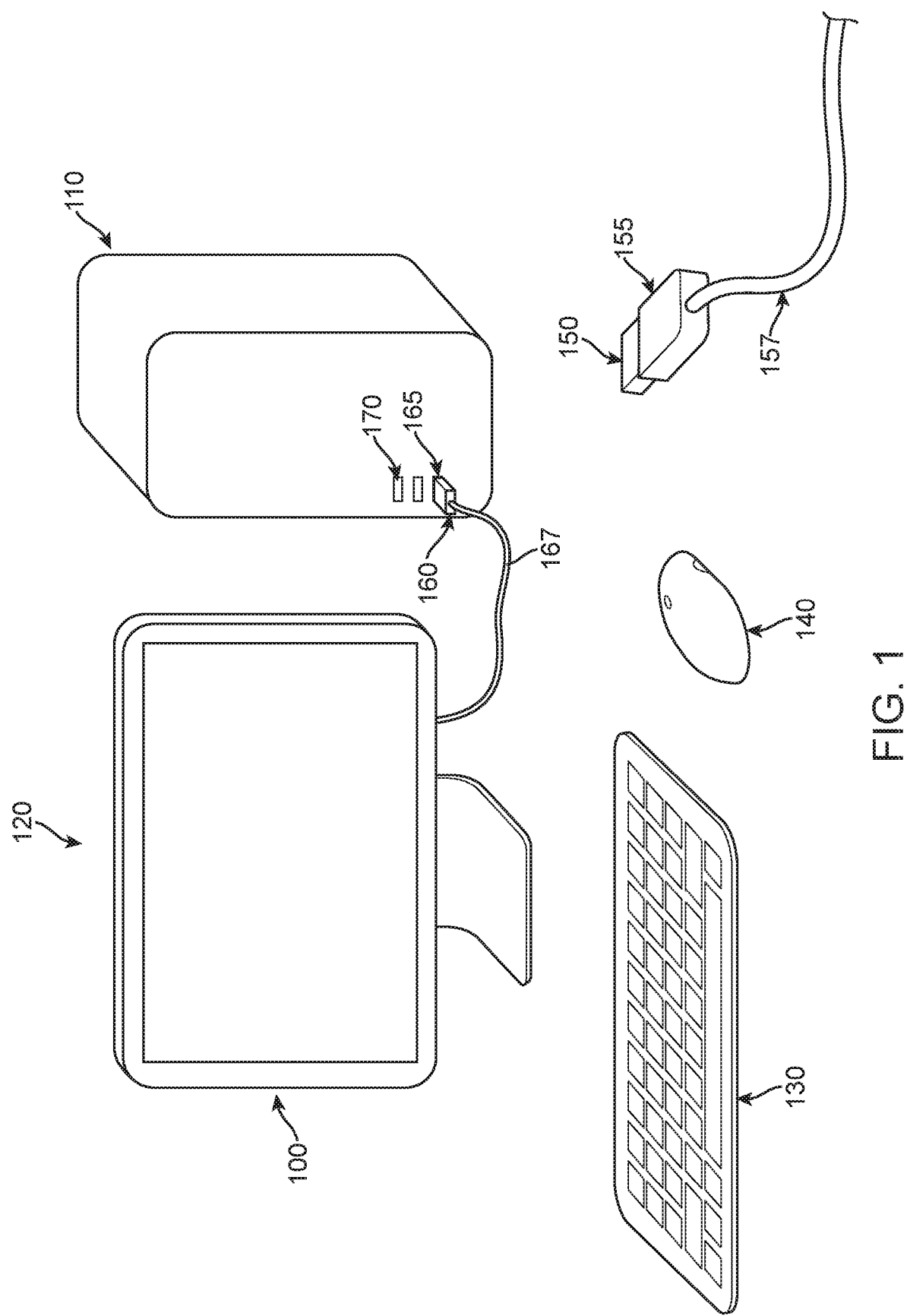

Top View

Side View

Front View

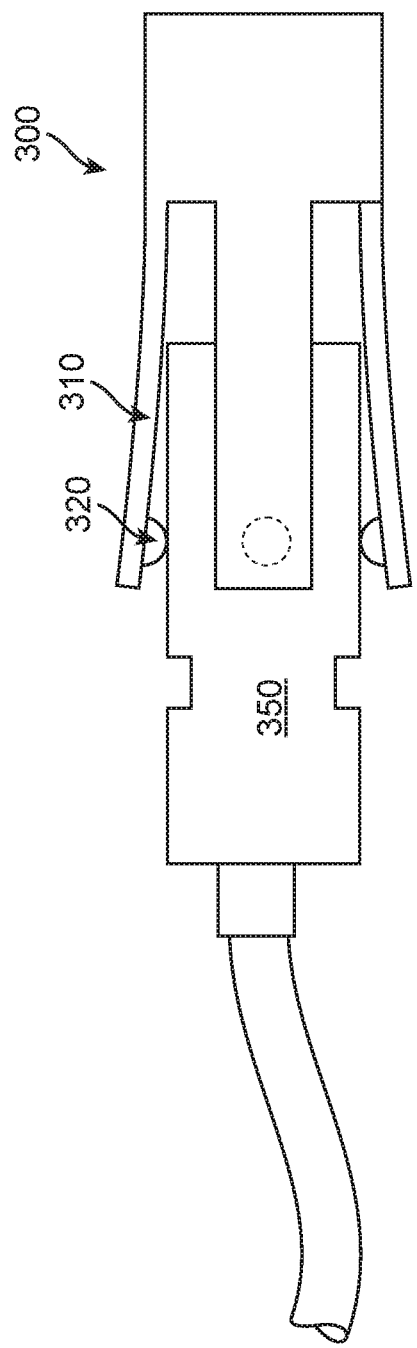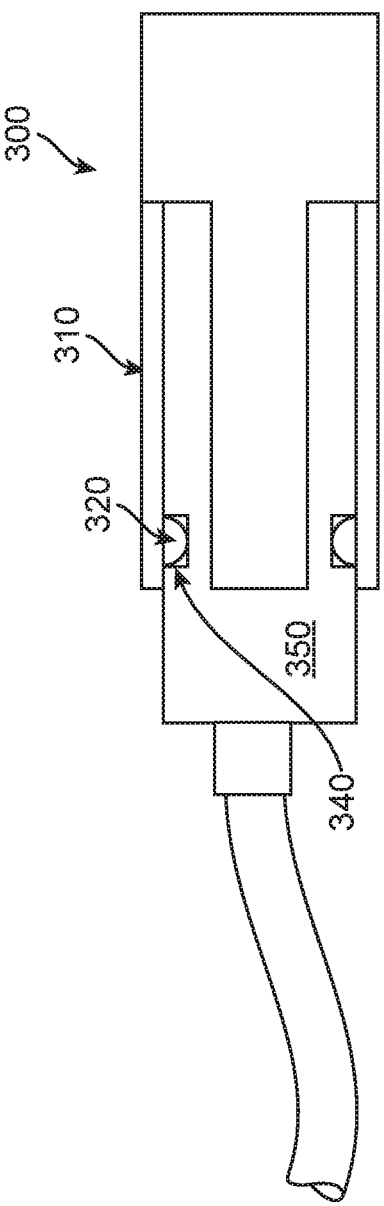
FIG. 3A
FIG. 3B

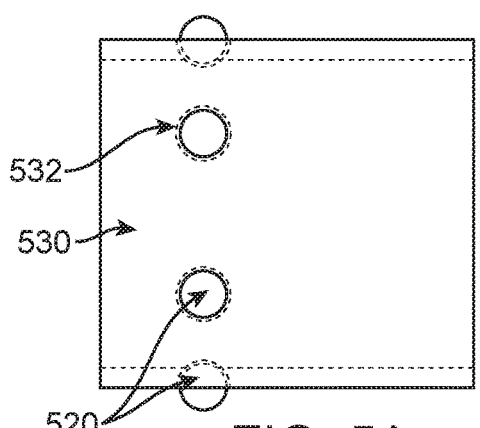
FIG. 5A
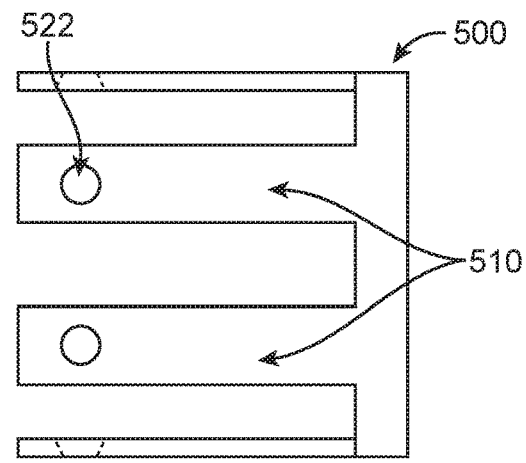
FIG. 5B
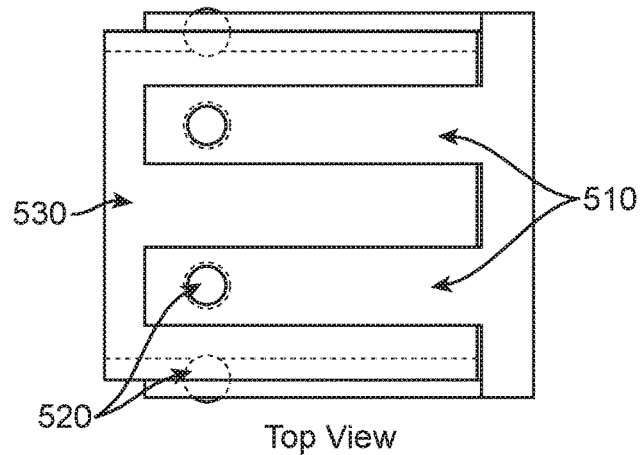
Top View
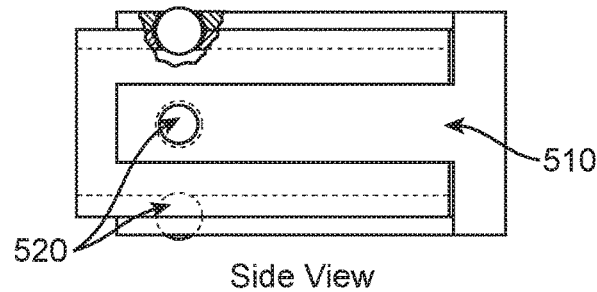
Side View
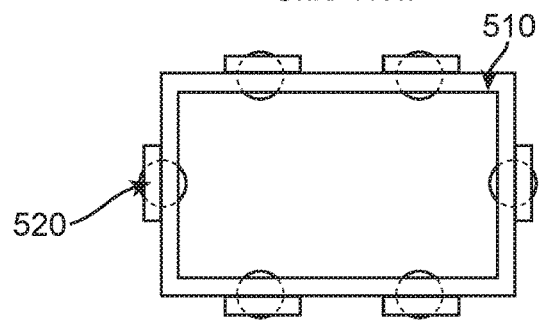
Front View
FIG. 5C

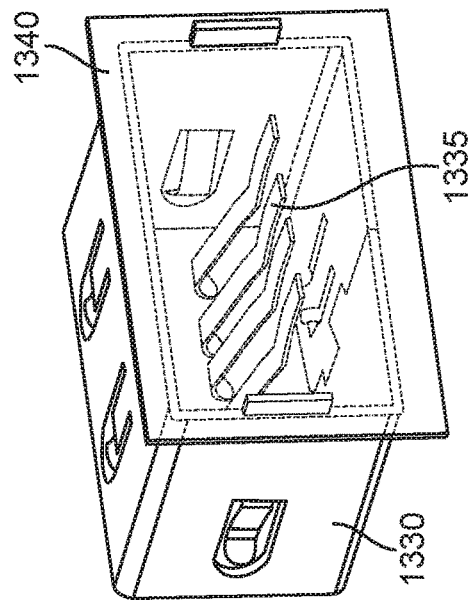
FIG. 13A
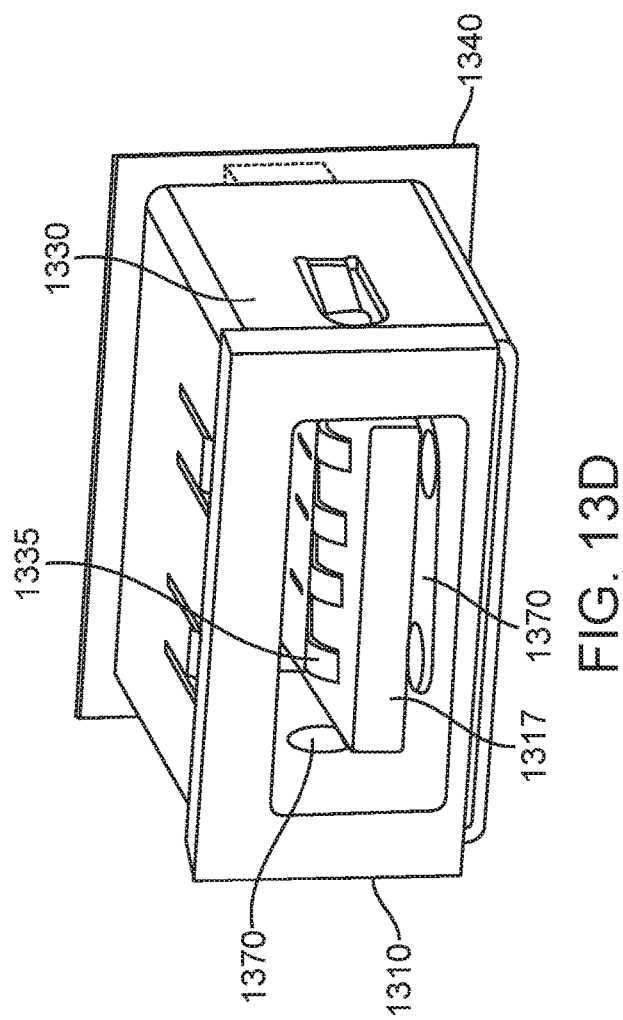
FIG. 13B
FIG. 13D
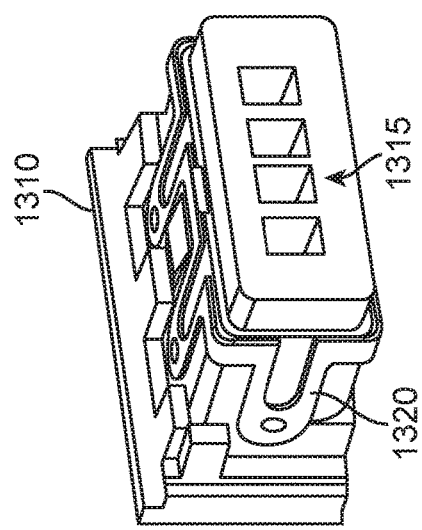
FIG. 13C

SIMPLIFIED CONNECTOR RECEPTACLE HOUSINGS

This application is a continuation of U.S. patent Ser. No. 15/396,651, filed Dec. 31, 2016, which is a continuation of U.S. patent Ser. No. 14/463,580, filed Aug. 19, 2014, which is a continuation of U.S. patent application Ser. No. 12/895,183, filed Sep. 30, 2010, which is a continuation-in-part of U.S. patent application Ser. No. 12/854,180, filed Aug. 11, 2010, which is a divisional of U.S. patent application Ser. No. 12/571,376, filed Sep. 30, 2009, which are incorporated by reference.

BACKGROUND

Data transfers between devices such as computers and peripheral devices, including portable media devices, have become ubiquitous the last several years. Music, phone numbers, video, and other data are moved among these devices, often using universal serial bus (USB), FireWire™, DisplayPort™, or other types of cables. Such cables are used to form electrical pathways for signals that carry this information.

These electrical connections are typically formed by inserting connector inserts on each end of a cable into connector receptacles located on the computer and peripheral device. The connector receptacles are often formed using a metal housing to limit the propagation of stray signal components that would otherwise interfere with other signals.

The metal housing is typically stamped to form fingers. These fingers are then bent to form finger contacts. These finger contacts form an electrical connection with a shield on the connector insert and hold the connector insert when it is placed in a connector receptacle. However, these finger contacts may have sharp edges or burrs that may result during the stamping process. These edges or burrs can scratch or otherwise mar a connector insert after many insertions into a connector receptacle. Also, it is desirable that these finger contacts provide a secure snap or feel when accepting an insert. This provides the user with a mechanical feedback, letting her know that a connection has been made.

These connector receptacles are conventionally made separately, and out of a different material, than the enclosure that otherwise encompasses the computer or portable media player. This results in a seam that is formed near the opening of a connector receptacle at the interface of the receptacle and computer or peripheral device enclosure. These seams can become increasingly pronounced during the lifetime of the device after repeated stresses caused by connector insert insertions and the pulling of cables when inserted into the receptacle. These seams can be an unwanted blemish on an otherwise aesthetically-pleasing device.

Thus, what is needed are structures, methods, and apparatus that provide connector receptacles having a reduced tendency to scratch and otherwise cause wear to connector inserts. It is also desirable that such receptacles provide a secure tactile response when an insert is inserted. It is also desirable to provide connector receptacles having a pleasing appearance.

SUMMARY

Accordingly, embodiments of the present invention provide structures, methods, and apparatus for connector receptacles that have a reduced tendency to scratch and otherwise cause wear to connector inserts, have an improved tactile response when connector inserts are inserted, and have an aesthetically desirable appearance.

Various embodiments of the present invention can reduce scratches and wear by utilizing domes, cylinders, spheres, or other structures as receptacle housing finger contacts. A specific embodiment of the present invention may utilize a dome-shaped indentation in a frame of a connector receptacle. The frame may be made of metal or other material. The dome-shaped indentations may be arranged to fit into slots in a connector insert to provide a secure fit between the connector insert and connector receptacle. The domes can provide a surface that is substantially free from edges and burrs that would otherwise scratch or mar the surface of an insert, thereby causing wear. The domes may be located on a flexible frame that can expand to fit over a receptacle housing. These flexible frames may be conductive and grounded to provide electromagnetic impulse (EMI) shielding, thereby protecting circuitry in the computer, peripheral device, portable media player, or other device enclosed within the connector receptacle. The flexible frames may also be further at least partially enclosed by a second conductive frame for further EMI shielding and for overheating and fire reasons. The dome-shaped indentation may be made by stamping or other appropriate process.

Another specific embodiment of the present invention reduces scratches by utilizing cylindrical disks as finger contacts. These hockey-puck-shaped disks may be arranged to fit into slots in the connector inserts to provide a secure fit when a connector is inserted into a connector receptacle. The disks can provide a surface that is easily manufactured and reduces marring. The disks can be attached to a flexible frame that can expand to fit over a receptacle housing. As before, the frames can be grounded for shielding and they can be further shielded with a second conductive frame. The disks may be soldered or otherwise affixed to the flexible frame.

Another specific embodiment of the present invention reduces scratches and wear by employing spheres as finger contacts. These balls or spheres may be free to rotate when a connector insert is inserted into a connector receptacle. These spheres may be located in openings in a connector receptacle housing that are arranged such that the balls fit into slots in the connector inserts when inserted into a connector receptacle to provide a secure fit. The spheres may be held in place by a flexible frame that can expand to fit over the spheres and receptacle housing. Since the spheres are free to rotate when an insert is inserted, they can provide a low resistance but secure feel to a user. As before, the frames can be grounded for shielding and they can be further shielded with a second conductive frame for further EMI and overheating and fire protection. The spheres may be held in place by a vacuum or other pressure differential, by magnetic fields, or by other means, while the flexible frame is put in place. In other embodiments of the present invention, other shapes besides domes, cylinders, and spheres may be used. For example, other spheroid shapes may be used, and they may be fixed, that is, attached to or formed from a frame. These spheroids may be free to turn, rotate, twist, or otherwise move when a connector insert is inserted in a connector receptacle.

Various embodiments of the present invention can provide aesthetically-pleasing receptacle housings by forming receptacle housings using the same type of material, or material having the same or similar color or texture, as is used for the enclosure for the electronic device that includes the receptacle. In one specific embodiment of the present invention, a receptacle housing can be formed using plastic. To reduce EMI interference, the plastic receptacle housing can be at least partially enclosed in a conductive frame. The frame may have the above domes, cylinders, or balls, or other shaped EMI contacts to form an electrical path with a shield on a connector insert that is inserted into the connector receptacle. The frame may be flexible to fit around the receptacle housing. The frame may be enclosed in a second conductive frame for further EMI protection and for heat and fire reasons. The connector receptacle can then be connected to a flexible or printed circuit board and aligned with a matching opening in the electronic device.

Other embodiments of the present invention can provide an aesthetically-pleasing receptacle housing by forming receptacle housings that may be, at least in part, contiguous with an enclosure containing an electronic device that also includes the connector receptacle. In a specific embodiment of the present invention, a portion of the connector receptacle near its opening may be formed contiguously with, that is, may be formed as part of, the device enclosure. Other portions away from the opening may be formed separately. As before, at least part of the receptacle housing may be enclosed in a conductive frame. The frame may have domed, cylindrical, spherical, or other shaped finger contacts. The frame may be flexible to fit around the receptacle housing. This frame may be enclosed in a second conductive frame.

Other embodiments of the present invention provide an aesthetically pleasing connector receptacle housing by forming receptacle housings that can be contiguous with the enclosure containing the electronic device that also includes the receptacle, that is, they can be formed as part of the enclosure. A specific embodiment of the present invention further forms a tongue as part of the connector receptacle and device enclosure. Conductive contacts may then be placed on the tongue to form electrical paths with contacts in a connector insert. As before, at least part of the receptacle housing may be enclosed in a conductive frame. The frame may have domed, cylindrical, ball, or other shaped EMI contacts. The frame may be flexible to fit around the receptacle housing. This frame may be enclosed in a second conductive frame.

In various embodiments of the present invention, the connector receptacle may be a USB, DisplayPort, IEEE 1394 (FireWire), Ethernet, or other type of connector receptacle. The connector receptacle housings can be formed from the same material used to form the enclosure for the device that includes the connector receptacle. These materials can include aluminum, plastic, ceramics, or other material. The frames, disks, spheres, and other components can be formed using conductive or nonconductive materials, such as aluminum, brass, steel, stainless steel, spring steel, palladium nickel alloy, copper, and other materials. These materials may be plated, for example, they may be palladium-nickel plated, or plated with other appropriate materials. For example, the spheres may be palladium-nickel plated. Connector receptacle consistent with embodiments of the present invention may be located on computer enclosures or other enclosures, such as those used for desktop computers, laptop computers, netbook computers, media players, portable media players, tablet computers, cell phone, or other electronic devices.

Another embodiment of the present invention may provide a connector receptacle having a simplified housing. Specifically, this connector receptacle may include a housing where a portion of the housing has been omitted to save space. In various embodiments of the present invention, various portions of the housing may be omitted. For example, this portion may be a top of a connector receptacle housing, such that its absence is not particularly noticeable to an observer. Removing the top of the housing may reduce the height of the connector receptacle in order to save space in a device housing the connector receptacle.

Various embodiments of the present invention may incorporate one or more of these and the other features described herein. A better understanding of the nature and advantages of the present invention may be gained by reference to the following detailed description and the accompanying drawings.

BRIEF DESCRIPTION OF THE DRAWINGS

FIG. 1 illustrates a computer system that may be improved by the incorporation of embodiments of the present invention;

FIGS. 3A-3B illustrate the reaction of a connector receptacle frame consistent with an embodiment of the present invention as an insert is inserted;

FIGS. 5A-5C illustrate a connector receptacle incorporating finger contact spheres according to an embodiment of the present invention;

FIGS. 13A-13D illustrate a connector receptacle housing and tongue that may be formed with a device enclosure according to an embodiment of the present invention at various times during a manufacturing process;

DESCRIPTION OF ILLUSTRATIVE EMBODIMENTS

Figure 2A:
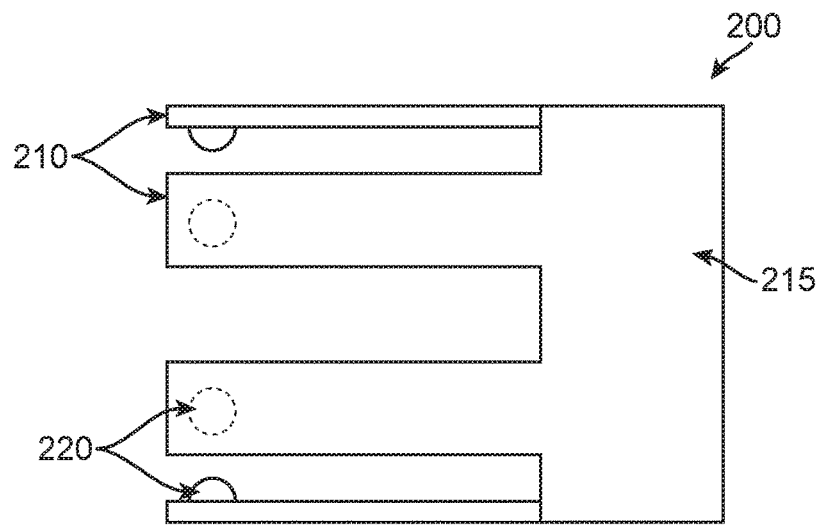
FIGS. 2A-2C illustrate top, side, and front views of a frame for a connector receptacle according to an embodiment of the present invention.

FIG. 1 illustrates a computer system that is improved by the incorporation of embodiments of the present invention.

This figure shows an example of a computer system 100 that includes computer enclosure 110, computer monitor 120, keyboard 130, and mouse 140. Monitor 120, keyboard 130, and mouse 140 may connect to computer enclosure 110 via cables. For example, computer monitor 120 is shown as being connected to computer enclosure 110 via cable 167. Keyboard 130, mouse 140, and other devices may be connected to computer enclosure 110 via cables such as cable 157.

Cables 157 and 167 can include connector insert housings 155 and 160. Insert housings 155 and 160 allow a user to hold the end of the cable and insert a connector insert, such as connector insert 150, into connector receptacle 170 on computer enclosure 110.

Embodiments of the present invention may be employed to improve connector receptacles such as connector receptacles 165 and 170. These connector receptacles may be compatible with USB, FireWire, DisplayPort, Ethernet, and other types of signaling and power transmission standards. These connector receptacles may be compatible with proprietary signaling and power transmission technologies. Also, as new signaling and power transmission standards and proprietary technologies are developed, embodiments of the present invention may be used to improve connector receptacles consistent with those standards and technologies. The connector receptacles may be located on computer enclosures, such as computer enclosure 110, or other enclosures, such as those used for desktop computers, laptop computers, netbook computers, media players, portable media players, tablet computers, cell phone, or other electronic devices.

These connector inserts are typically shielded with metal for signal integrity purposes. The shielding on the connector inserts make electrical contact with metallic finger contacts on the connector receptacle housing to form an electrical connection. Typically, the connector receptacle housing is connected to ground inside computer enclosure 110.

These conventional connector receptacle finger contacts may have sharp edges or burrs that can scratch or mar connector inserts as they are inserted into a connector receptacle. This can lead to undesirable wear and a diminished appearance. Accordingly, various embodiments of the present invention provide finger contacts that reduce wear on connector inserts. Some examples are shown in the following figures.

Figure 2B:
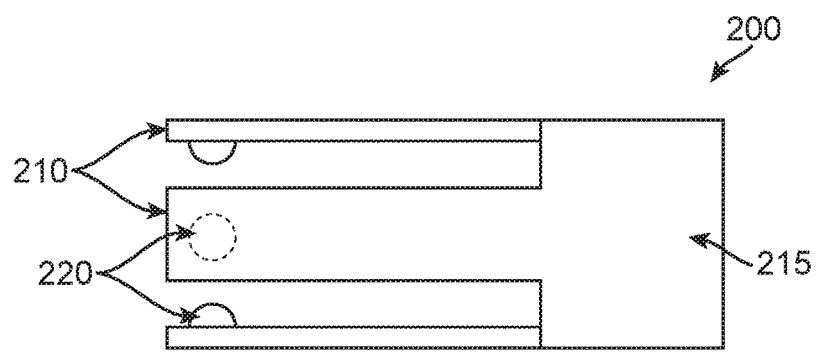
Figure 2C:
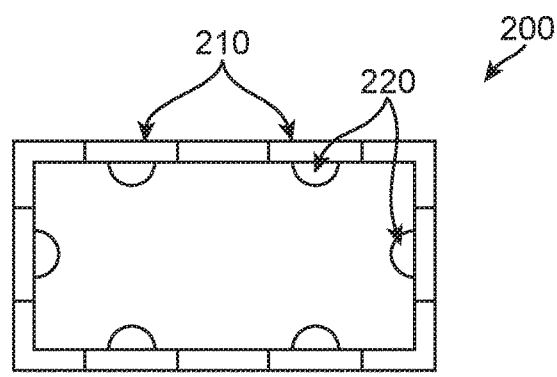

FIGS. 2A-2C illustrate top, side, and front views of a frame for a connector receptacle according to an embodiment of the present invention. These figures, as with the other included figures, are shown for illustrative purposes and do not limit either the possible embodiments of the present invention or the claims.

These figures show a frame 200 that may be used alone or in conjunction with a connector receptacle housing to form a connector receptacle according to an embodiment of the present invention. FIG. 2A illustrates a top view of frame 200. Frame 200 includes base area 215 that provides mechanical support for fingers 210. Fingers 210 can each have a dome-shaped finger contact 220. FIG. 2B illustrates a side view, and FIG. 2C illustrates a front view of frame 200. In various embodiments of the present invention, fingers 210 can be made comparatively wide. This reduces series resistance and improves EMI performance. This is particularly true in comparison to conventional stamped fingers.

Frame 200 and finger contacts 220 can be formed of metal or other material. Frame 200 and finger contacts 220 can be formed of the same type of metal or other material, or they may be formed of different materials. For example, frame 200 and fingers 210 may be formed of a flexible metal to allow the insertion of connector inserts, while finger contacts 220 may be made of a harder, more durable material. Frame 200 may be formed using steel, stainless steel, aluminum, palladium-nickel alloy, or other material. Frame 200 may also be plated. For example, frame 200, or portions of frame 200, such as the finger contacts 220, may be palladium-nickel plated. Finger contacts 220 may be made by forming divots or depressed areas in fingers 210. Alternately, they may be formed by attaching dome-shaped protrusions to fingers 210. Finger contacts 220 may have a dome shape, or they may have other shapes. For example, they may have other rounded or contoured, or other types of shapes. These rounded shapes are substantially free of edges and burrs, and therefore limit the scratches they impart to connector inserts as they are inserted.

FIGS. 3A-3B illustrate the reaction of a receptacle frame 300 consistent with an embodiment of the present invention as an insert 350 is inserted. Specifically, in FIG. 3A, as connector insert 350 is inserted, fingers 310 deform to provide space in connector receptacle frame 300. In FIG. 3B, when connector insert 350 is fully inserted in connector receptacle frame 300, dome-shaped finger contacts 320 fit into slots 340 in connector insert 350. This allows fingers 310 of connector receptacle frame 300 to spring back into place. Having finger contacts 320 inside cutouts 340 of insert 350 provides mechanical stability for connector insert 350 and helps to prevent accidental extraction from connector receptacle frame 300.

In this way, as connector insert 350 is inserted into connector receptacle frame 300, connector insert 350 comes in contact with finger contacts 320. Since finger contacts 320 are dome-shaped and substantially free from sharp edges or burrs, connector insert 350 can experience less wear and tear than it would with a conventional connector receptacle.

Again, frame 300 may be used in conjunction with a connector receptacle housing formed of plastic or other material. The receptacle housing may be a dedicated housing. That is, it may be separate from the device enclosure that contains the connector receptacle. In another embodiment of the present invention, some or all of the receptacle housing may be formed as part of the device enclosure. For example, frame 300 may be used in conjunction with a receptacle housing and tongue that are both formed as part of a device enclosure that contains the connector receptacle. The receptacle housing and device enclosure may be made of plastic, ceramic, aluminum, or other material. One example of how frame 300 may be used in conjunction with a plastic receptacle housing is shown in the following figure.

Figure 4A:
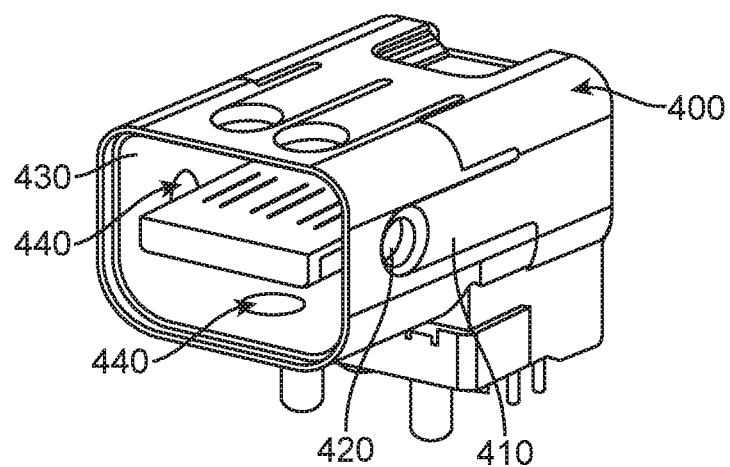
FIGS. 4A-4B illustrate connector receptacles according to an embodiment of the present invention.
Figure 4B:
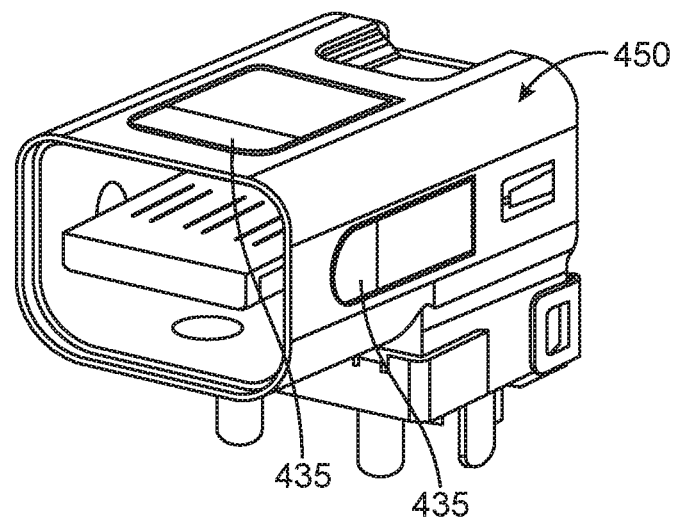

FIGS. 4A-4B illustrate connector receptacles according to an embodiment of the present invention. FIG. 4A illustrates a connector receptacle including a connector receptacle housing 430 that is partially covered by frame 400. Connector receptacle housing 430 may be formed of plastic, ceramic, or other material. Frame 400 may be made of metal or other material. Frame 400 includes a number of fingers 410, each having a finger contact 420. As before, finger contacts 420 may be dome-shaped. In other embodiments of the present invention, they may have other shapes as appropriate to reduce connector insert wear.

Again, employing figure contacts 420 reduces wear on connector inserts that otherwise can occur after several insertions into a connector receptacle. This improves the long-term appearance of the connector inserts. It is also desirable to reduce the visible wear that degrades the appearance of the connector receptacle. Accordingly, various embodiments of the present invention provide raised areas in a connector receptacle. These raised areas experience wear instead of the other portions of the connector receptacle housing. Since these raised areas may be set back from the front of a connector receptacle, they may experience wear and protect the front areas of the connector receptacle, thereby improving the long-term appearance of the connector receptacle. In various embodiments of the present invention, the opening of the connector receptacle is made larger to account for the raised areas. In this way, the size of the opening of the connector receptacle can be made compliant with appropriate signal or power transmission standards when the raised areas are employed.

These raised areas can be located around the finger contact areas in a connector receptacle, or they may be located in other areas inside a connector receptacle. In a specific embodiment of the present invention, two raised areas are included, one on the top and one on the bottom of the inside of the connector receptacle. Each raised area surrounds two finger contacts. In another embodiment of the present invention, additional raised areas are located on the sides of a connector receptacle. These additional raised areas may also surround finger contacts on the sides of a connector receptacle. The raised areas may be made of the same material as the connector receptacle housing, or they may be made of a different material.

In the specific example shown in FIG. 4A, raised areas 440 are used. These raised areas can wear first, thus protecting the rest of the connector receptacle.

Again, as a connector insert (not shown) is inserted into the connector receptacle, fingers 410 deflect or open up, thereby allowing a connector insert to be inserted. Finger contacts 420 mate with cutouts on the connector insert (not shown), allowing fingers 410 to return to position when the insert is fully engaged. Frame 400 and fingers 410 may be formed of a flexible metal or other material having a spring-like quality, such that fingers 410 can deflect and return to their original position. Fingers 410 and finger contacts 420 may be made of the same material or they may be made of different materials. For example, finger contacts 420 may be made of a more durable material than fingers 410 in order to enhance the lifetime of the connector receptacle, while providing fingers 410 having the desired flexibility.

In these examples, six fingers 410 are shown. In other embodiments of the present invention, other number of fingers may be used. For example, four fingers may be used, two on a top and two on a bottom of a connector receptacle frame. In some embodiments of the present invention, it may be desirable to provide reinforcement for fingers 410. For example, such a reinforcement could increase the hold of finger contacts 420, thereby reducing the likelihood of accidental extraction of a connector insert. Accordingly, in some embodiments of the present invention, a shell is provided around frame 400. A shell can be used to increase resistance to fire caused by excessive heat buildup at the connector contacts, provide additional electromagnetic interference shielding, and provide additional mechanical support for the connector receptacle. An example is shown in FIG. 4B.

FIG. 4B illustrates a connector receptacle having an additional shell 450 according to an embodiment of the present invention. Shell 450 may be metallic, ceramic, or formed of other material. In this example, shell 450 includes fingers 435. These fingers 435 allow movement of fingers 410 on frame 400, thereby allowing deflection of fingers 410 when a connector insert is inserted and removed.

In an embodiment of the present invention, dome-shaped or other shaped finger contacts are used to reduce wear when a connector insert is inserted into a connector receptacle housing. In other embodiments of the present invention, spheres or balls are used as finger contacts. This allows the finger contacts to rotate when an insert is inserted into a connector receptacle. Since these spheres rotate, they present a new surface to the connector inserts as they are inserted. This prevents wear on the spheres that could eventually mar a connector insert. They also provide a smooth feeling to a user when the user is inserting a connector insert. An example is shown in the following figure.

FIGS. 5A-5C illustrate a connector receptacle incorporating finger contact spheres according to an embodiment of the present invention. FIG. 5A illustrates a connector receptacle housing 530 having openings or holes 532 into which spheres 520 are placed. FIG. 5B illustrates a frame 500 having fingers 510, each having an opening 522 in which sphere 520 can fit when frame 500 is placed over connector receptacle housing 530.

During assembly, spheres 520 can be held in place in connector receptacle housing 530, while frame 500 is fitted over connector receptacle housing 530. For example, spheres 520 can be held in place by a vacuum. In a specific embodiment of the present invention, connector receptacle housing 530 is placed in a quantity of spheres 520. A vacuum is created in the connector receptacle housing 530, thereby drawing spheres 520 into openings in connector receptacle housing 530. While spheres 520 are held in place, frame 500 can be fitted over spheres 520 and housing 530. Again, openings 522 in fingers 510 of frame 500 fit over spheres 520 holding them in place in connector receptacle housing 530. In another specific embodiment of the present invention, spheres 520 are held in place during assembly by magnetic attraction. For example, a magnetic field is generated around connector receptacle housing 530, thereby drawing spheres 520 into openings in connector housing 530. Spheres 520 are magnetically held in place while frame 500 is placed over connector receptacle housing 530.

FIG. 5C illustrates top, side, and front views of a connector receptacle employing spheres 520 as finger contacts according to an embodiment of the present invention. Spheres 520 fit into openings in connector housing 530. Openings 522 in fingers 510 hold spheres 520 in place. Frame 500 and spheres 520 may be formed using steel, stainless steel, copper, palladium-nickel alloy, aluminum, brass, or other material. They may also be plated. For example, they may be palladium-nickel plated.

Figure 6A:
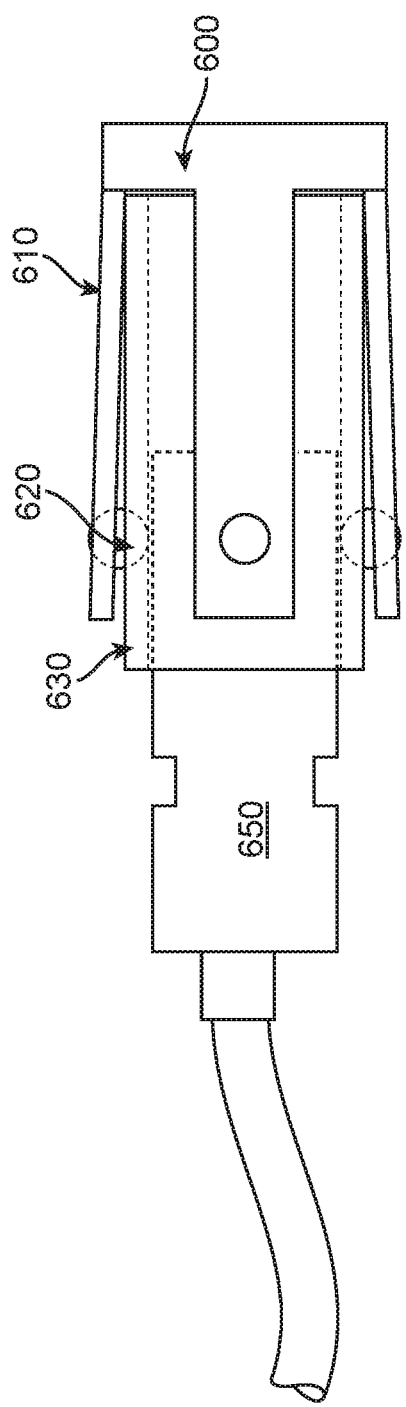
FIGS. 6A-6B illustrate the reaction of a connector receptacle employing spheres as finger contacts according to an embodiment of the present invention as an insert is inserted.
Figure 6B:
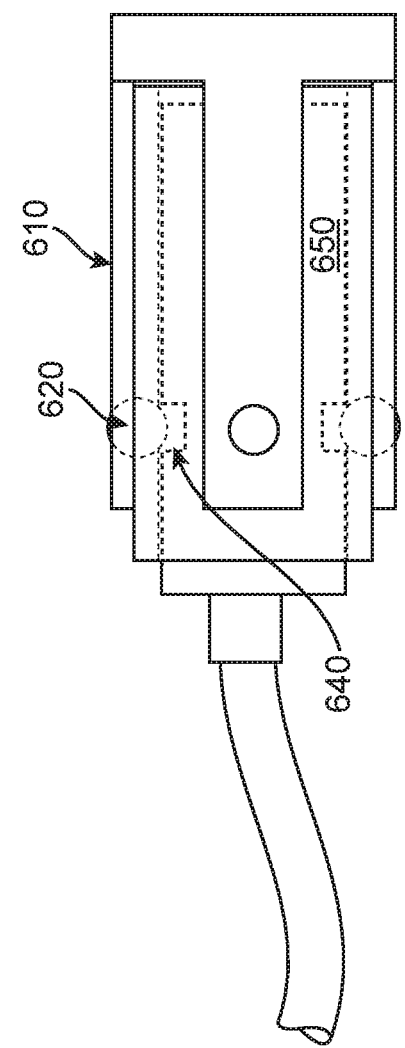

FIGS. 6A-6B illustrate the reaction of a connector receptacle employing spheres as finger contacts according to an embodiment of the present invention as an insert is inserted. In FIG. 6A, fingers 610 can deflect or open to allow insert 650 to be inserted into connector receptacle housing 630. As connector insert 650 is inserted, spheres 620 rotate. This rotation allows a new surface to be presented to connector insert 650, thereby reducing wear on connector insert 650. In FIG. 6B, connector insert 650 is fully engaged in connector receptacle housing 630. Spheres 620 fit in connector insert cutouts 640, thereby providing the tactile resistance to the extraction of connector insert 650.

In this example, spheres or balls are used as finger contacts. In other embodiments of the present invention, other shapes, such as cylinders, may be used. A more detailed example illustrating the use of spheres as finger contacts is shown in the following figures.

Figure 7A:
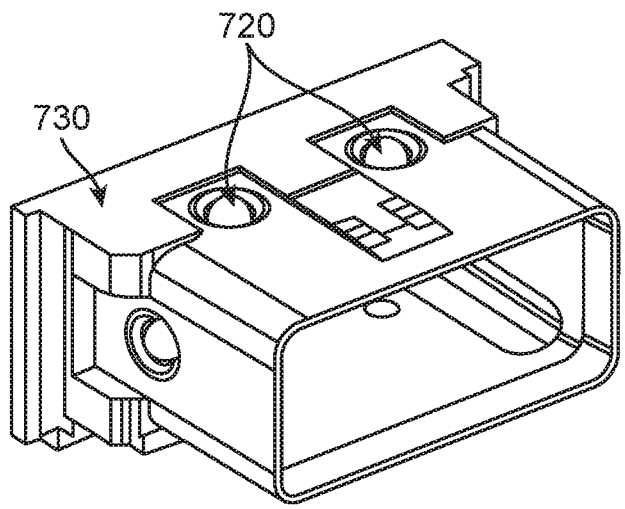
FIGS. 7A-7B illustrate a connector receptacle employing spheres as finger contacts according to an embodiment of the present invention.
Figure 7B:
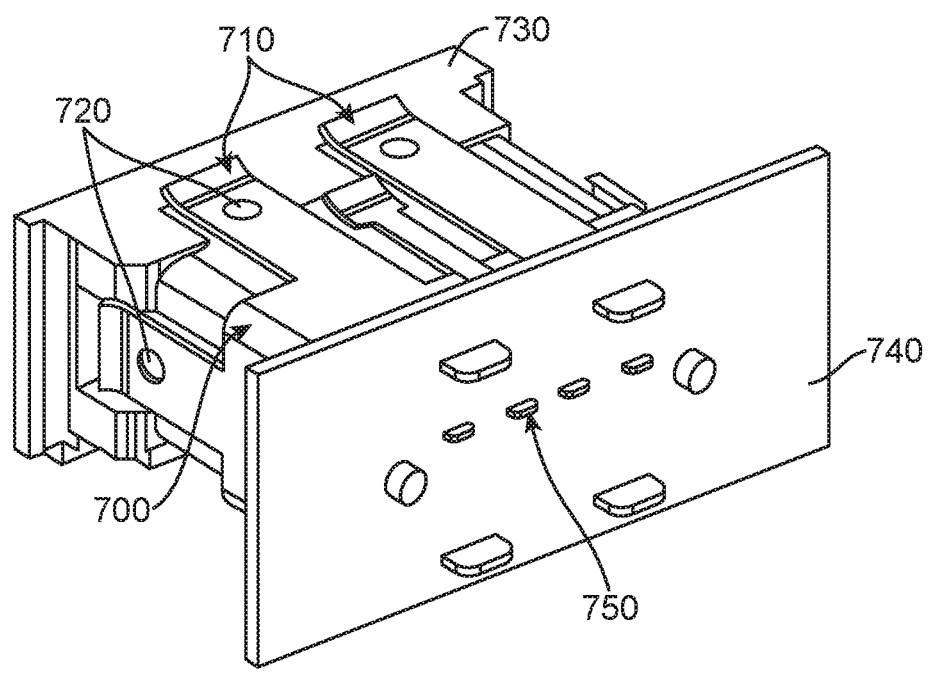

FIGS. 7A-7B illustrate a connector receptacle employing spheres as finger contacts according to an embodiment of the present invention. In FIG. 7A, spheres 720 can fit into openings in connector receptacle housing 730. In FIG. 7B, a frame 700 can be fitted over connector receptacle housing 730. Openings in fingers 710 fit over spheres 720, holding them in place. A flexible circuit board 740 or other connection may be used to form electrical pathways between connector receptacle contacts 750 and other electronic circuitry in the device (not shown.) While in this example a flexible circuit board 740 is shown, in this and the other included examples, connector receptacles according to embodiments of the present invention may be attached to flexible circuit boards, printed circuit boards, or other types of conductive pathways.

Again, a connector receptacle housing, such as connector housing 730, may be a separate piece of material, such as plastic, ceramic, or aluminum, from the enclosure of a device which houses the connector receptacle. In other embodiments of the present invention, all or some of the connector receptacle housing may be formed as part of a device enclosure. These device enclosures can house or enclose desktop, laptop, notebook, netbook, media players, portable media players, cell phones, or other types or electronic devices. Some examples of portions of connector receptacles that are consistent with embodiments of the present invention are shown in the following figures.

Figure 8C:
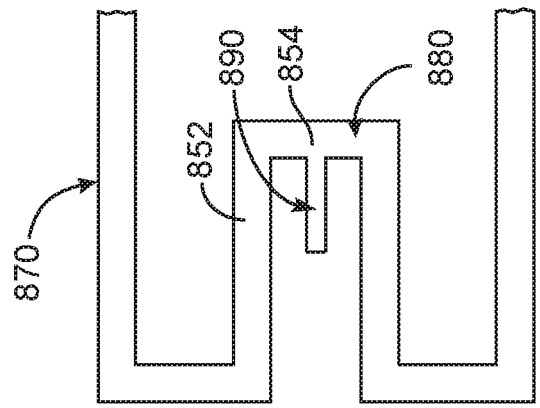
FIGS. 8A-8C illustrate examples of connector receptacle housing portions where the portion may be formed as part of a device enclosure according to embodiments of the present invention.
Figure 8B:
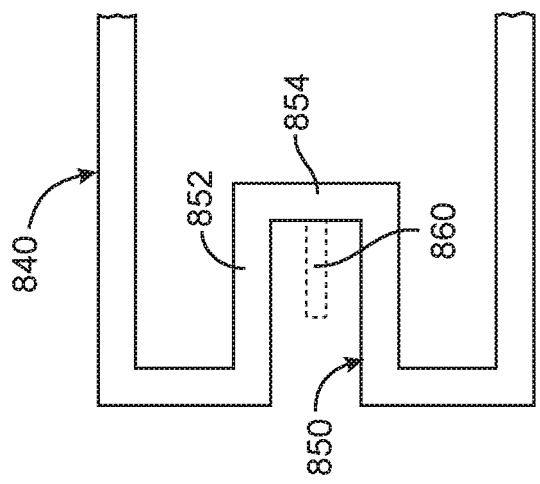
Figure 8A:
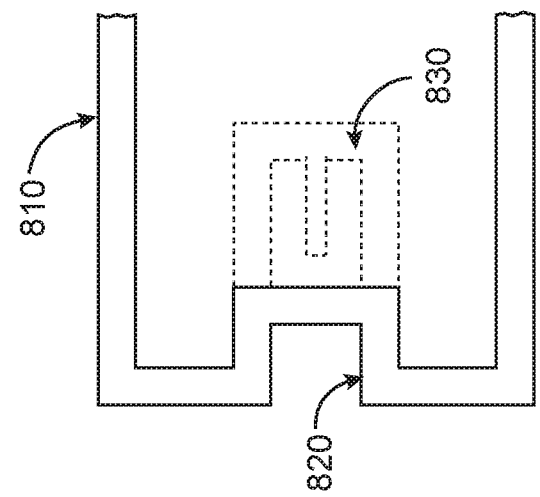

FIGS. 8A-8C illustrate examples where a portion of a connector receptacle housing may be formed as part of a device enclosure according to embodiments of the present invention. Incorporating at least a portion of the connector receptacle housing with a device enclosure allows the connector receptacle to visually appear as substantially integrated with the device enclosure and provides an aesthetically pleasing appearance. In FIG. 8A, a portion 820 of a connector receptacle can be formed with device enclosure 810. This provides a desired appearance, while being relatively easy to manufacture.

In FIG. 8B, a substantial portion of recess 850, which may include sidewall 852 and bottom surface 854, of the connector receptacle housing can be formed with device enclosure 840. In this example, tongue portion 860 of the connector receptacle housing can be formed separate from device enclosure 840. In FIG. 8C, connector receptacle housing 880, which may include sidewall 852, bottom surface 854, and connector receptacle tongue 890, may be integrally formed as part of device housing 870. In other embodiments of the present invention, other portions of a connector receptacle may be integrally formed with a device enclosure. These three example options are shown in the following figures.

Figure 9A:
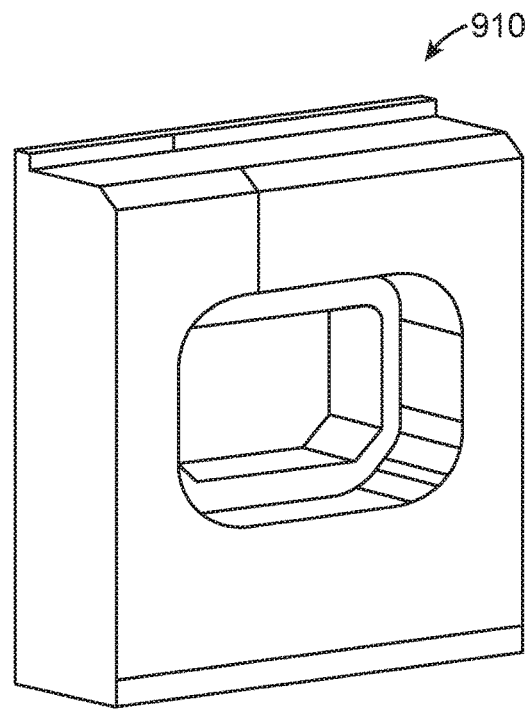
FIGS. 9A-9C illustrate examples of connector receptacle portions that may be integrated with a device enclosure according to embodiments of the present invention.
Figure 9B:
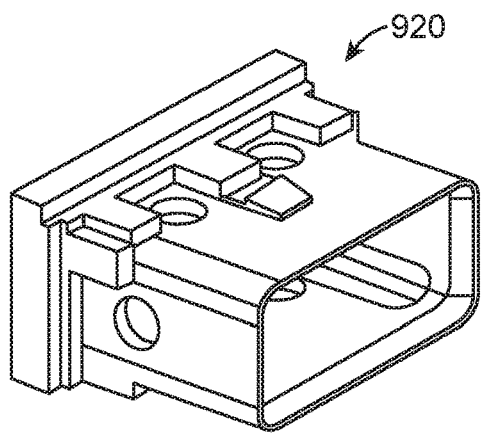
Figure 9C:
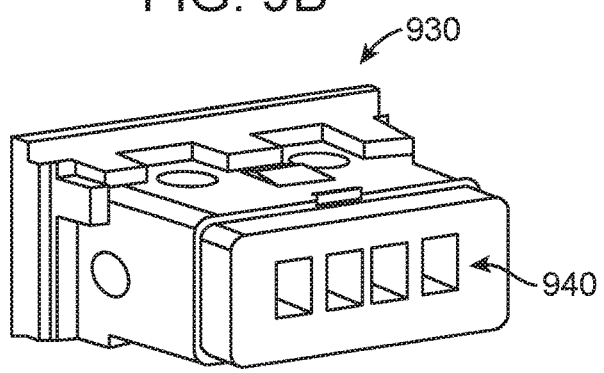

FIGS. 9A-9C illustrate connector receptacle portions that may be integrated with a device enclosure according to embodiments of the present invention. In FIG. 9A, a front portion 910 of a connector receptacle housing can be formed as a part of a device enclosure. This particular level of integration of connector receptacle housing with the device enclosure can be referred to as partial integration. When viewed from the front of the connector receptacle, the connector receptacle housing appears to be at least partially seamlessly integrated within the device enclosure. This provides an attractive appearance to the device. While a seam or part of a seam between the device enclosure and receptacle housing may be observable in some embodiments with this level of partial integration, this partial integration can be comparatively easy to manufacture.

FIG. 9B illustrates a portion of a connector receptacle housing that may be formed as part of the device enclosure according to an embodiment of the present invention. This embodiment provides a more seamless appearance between the device enclosure (not shown) and connector receptacle housing 920.

In FIG. 9C, a connector receptacle portion 940 including a tongue (not shown) may be formed in connector receptacle housing 930 as part of a device enclosure (not shown.) Various steps in a manufacturing processes that incorporate the above portions of a connector receptacle housing are shown in the following figures.

Figure 10A:
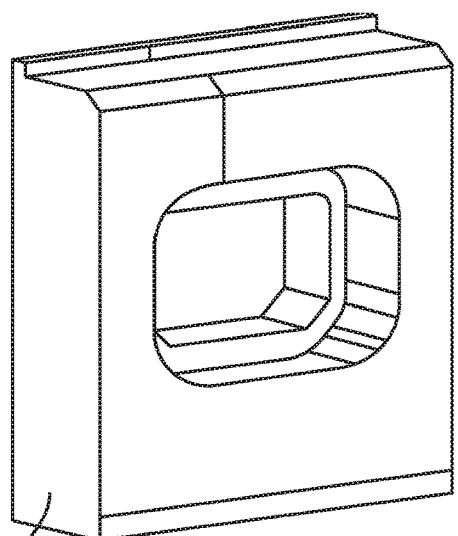
FIGS. 10A-10C illustrate a partially-integrated connector receptacle housing according to an embodiment of the present invention at various times during a manufacturing process.
Figure 10B:
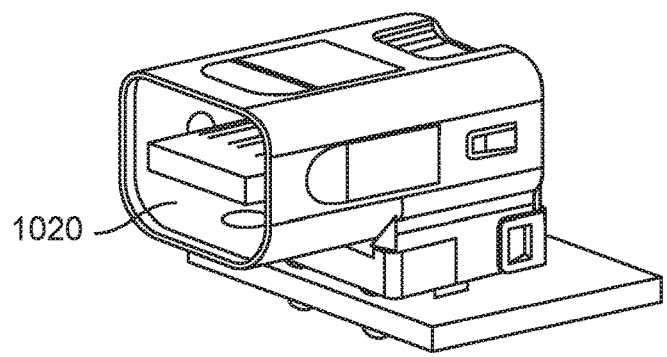
Figure 10C:
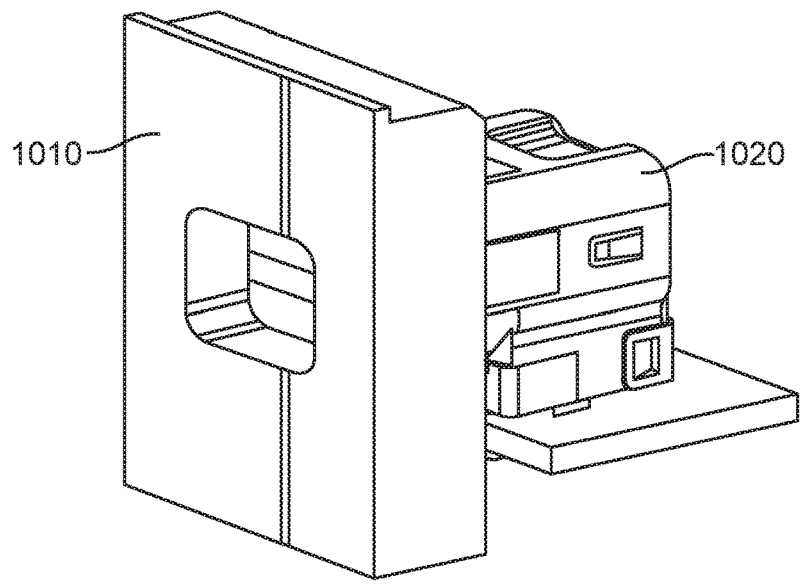

FIGS. 10A-10C illustrate a partially-integrated connector receptacle housing according to an embodiment of the present invention at various times during a manufacturing process. In FIG. 10A, a front portion 1010 of a connector receptacle housing may be formed as part of a device enclosure (not shown.) In FIG. 10B, a connector receptacle 1020, which may be the connector receptacle of FIG. 4B, is provided. In FIG. 10C, connector receptacle 1020 may be fitted to an opening in connector receptacle portion 1010. As seen from the front, the connector receptacle housing appears to be at least partially integrated with the device enclosure, thereby providing an improved appearance.

Figure 11B:
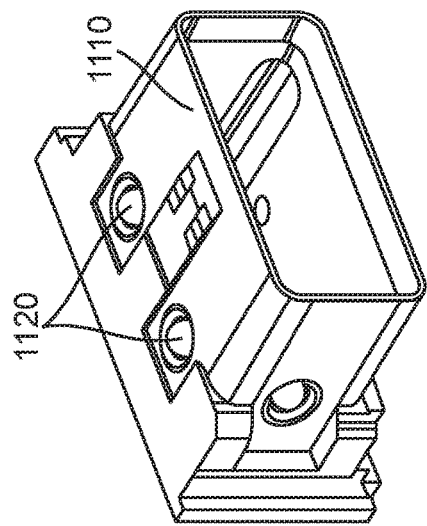
FIGS. 11A-11D illustrate a connector receptacle housing that may be formed with a device enclosure according to an embodiment of the present invention at various times during a manufacturing process.
Figure 11D:
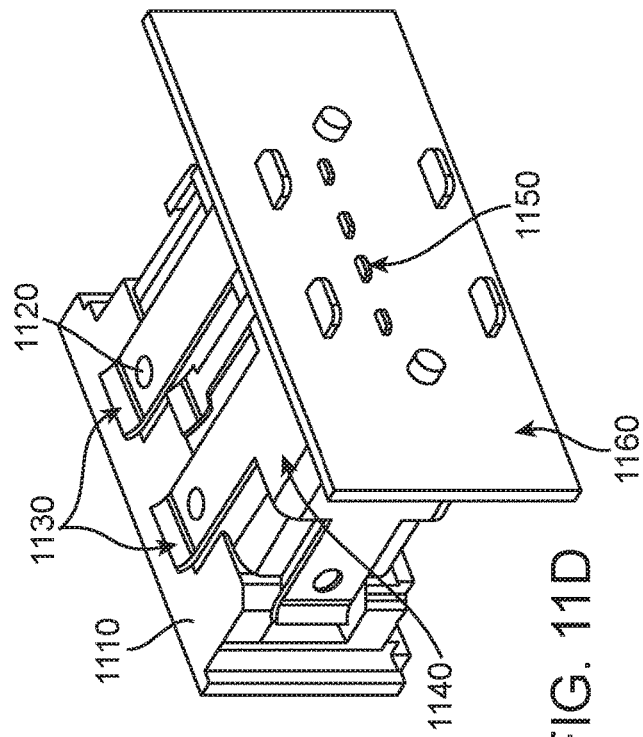
Figure 11A:
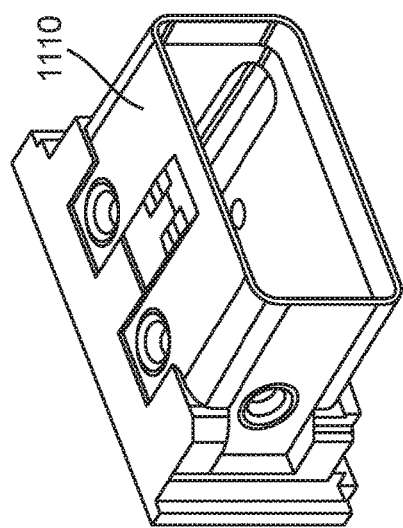
Figure 11C:
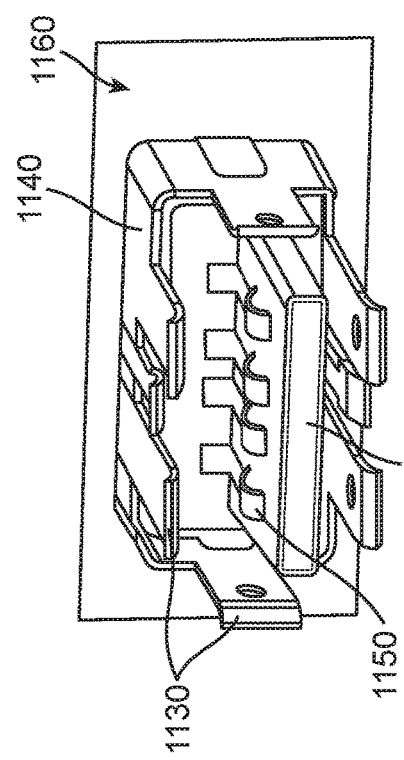

FIGS. 11A-11D illustrate a connector receptacle housing that can be formed with a device enclosure according to an embodiment of the present invention at various times during a manufacturing process. FIG. 11A illustrates a connector receptacle housing 1110 that may be formed along with a device enclosure (not shown.) In FIG. 11B, spherical finger contacts 1120 may be placed in openings in connector receptacle housing 1110. In FIG. 11C, a back portion of the connector receptacle including tongue 1170, contacts 1150, and frame 1140, including fingers 1130, may be assembled. This assembly, in this example, can then be connected to a flexible circuit board 1160.

In FIG. 11D, frame 1140 may be inserted over connector receptacle housing 1110. Fingers 1130 deflect over spheres 1120. Spheres 1120 may be held in place by holes in fingers 1130. Contacts 1150 can be made available to flexible circuit board 1160 for connection to circuitry inside the device (not shown.)

Figure 12C:
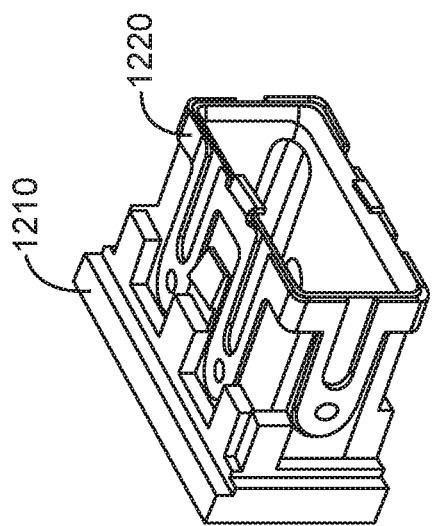
FIGS. 12A-12F illustrate another connector receptacle housing that may be formed with a device enclosure according to an embodiment of the present invention at various times during a manufacturing process.
Figure 12F:
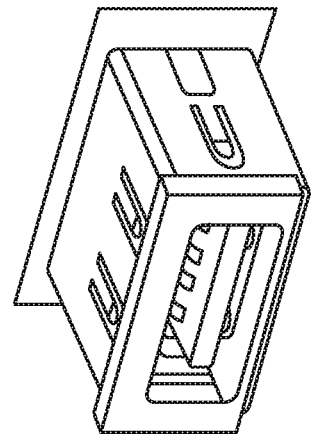
Figure 12B:
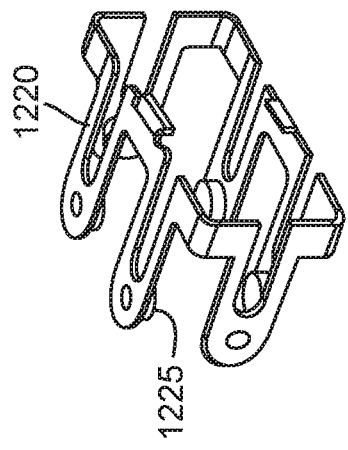
Figure 12E:
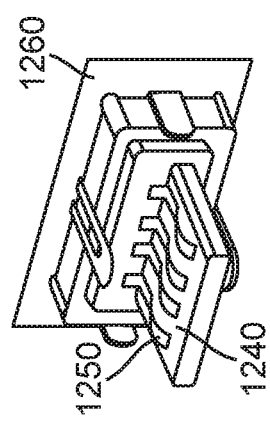
Figure 12A:
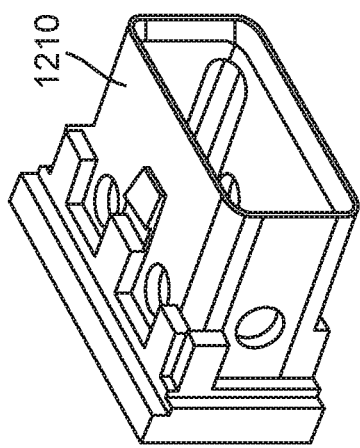
Figure 12D:
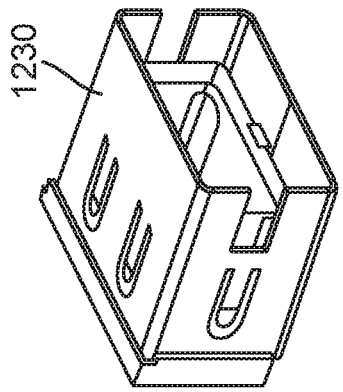

FIGS. 12A-12F illustrate another connector receptacle housing that may be formed with a device enclosure according to an embodiment of the present invention at various times during a manufacturing process. FIG. 12A illustrates a connector receptacle housing 1210 that can be formed as a portion of a device enclosure (not shown.) FIG. 12B illustrates a frame 1220 including finger contacts 1225. The finger contacts 1225 in this example are cylinders. These cylinders may be riveted or otherwise attached to frame 1220. In other embodiments, other types of finger contacts may be used. For example, domes or spheres may be used. Frame 1220, in this example, can be designed to spread such that it may be fitted over connector receptacle housing 1210. As before, finger contacts 1225 may be made of a different material from frame 1220. For example, finger contacts 1225 may be made of a harder material than that used to form frame 1220. In FIG. 12C, frame 1220 can fit over connector receptacle housing 1210.

Again, in some embodiments of the present invention, it is desirable to enclose frame 1220 in a shield. In this example, shield 1230 can be fit over frame 1220 and connector receptacle housing 1210 in FIG. 12D.

In FIG. 12E, connector receptacle tongue 1240 and contacts 1250 may be connected to a flexible circuit board 1260.

In FIG. 12F, this assembly may be inserted into connector receptacle housing 1210, thereby forming the connector receptacle.

In various embodiments of the present invention, it is desirable to integrate connector receptacle tongue 1240 as part of connector receptacle housing 1210. An example of this is shown in the following figure.

FIGS. 13A-13D illustrate a connector receptacle housing and tongue that may be formed with a device enclosure according to an embodiment of the present invention at various times during a manufacturing process. FIG. 13A illustrates a connector receptacle having a back portion 1315 and a tongue (not shown) that are formed as part of a device enclosure (not shown.) In FIG. 13B, a shield 1330 can be attached via contacts 1335 to a flexible circuit board 1340. In FIG. 13C this assembly may be fit to connector receptacle housing 1310. Specifically, shield 1330 may be fit over connector housing 1310. FIG. 13D illustrates a front view of the completed connector receptacle housing.

In this and the above examples, the finger contacts may have spherical, domed, cylindrical, or other shapes. These finger contacts reduce wear of connector inserts, provide a proper tactile response to the user, and provide mechanical security when connector inserts are inserted. Again, it is also desirable to reduce wear on the connector receptacle itself. As before, various embodiments of the present invention provide connector receptacles having one or more wear surfaces 1370.

These wear surfaces may be used in conjunction with the other embodiments shown above. As described above, the wear surfaces may be slightly raised portions 1370 in the connector receptacle housing. Raised portions 1370 may be formed of the same material as the other portions of connector housing 1310, or they may be made of a different material. For example, they may be made of a more durable material. Raised portions or surfaces 1370 may be arranged such that they experience the friction imparted by connector inserts as they are inserted into receptacle housing 1310. In this way, the surface near the front of the connector receptacle housing 1310 can experience less friction and attendant marring, and the look of the connector receptacle can be maintained over time.

In various embodiments of the present invention, it is desirable to provide connector receptacle housings for several connectors as a unit. For example, this can provide multiple connector receptacles that are aligned to each other. An example of how this may be done according to an embodiment of the present invention is shown in the following figures.

Figure 14B:
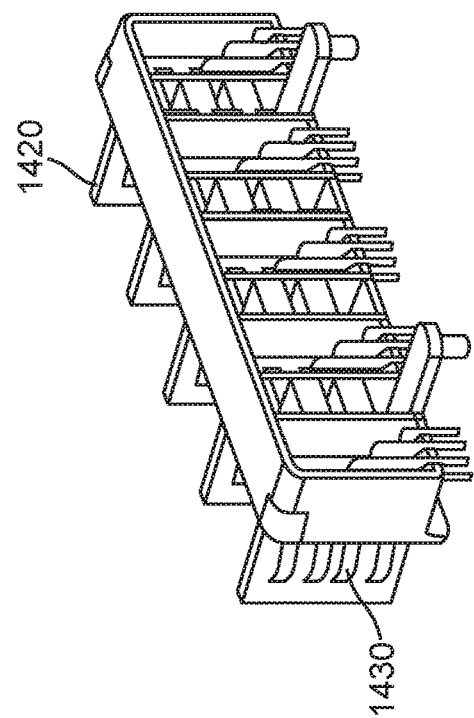
FIGS. 14A-14D illustrate a number of connector receptacles according to an embodiment of the present invention at various times during a manufacturing process.
Figure 14D:
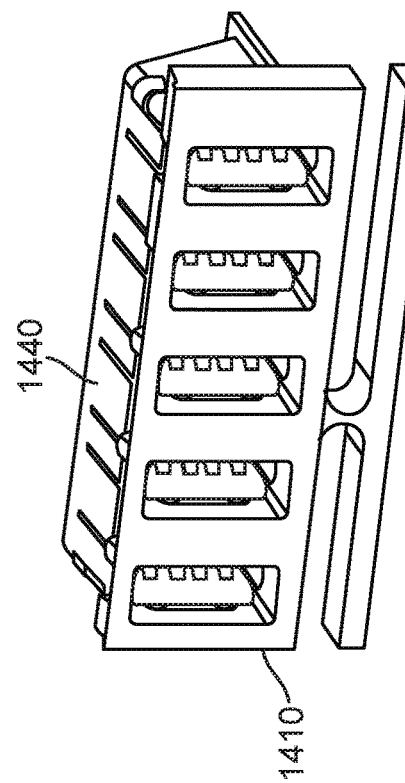
Figure 14A:
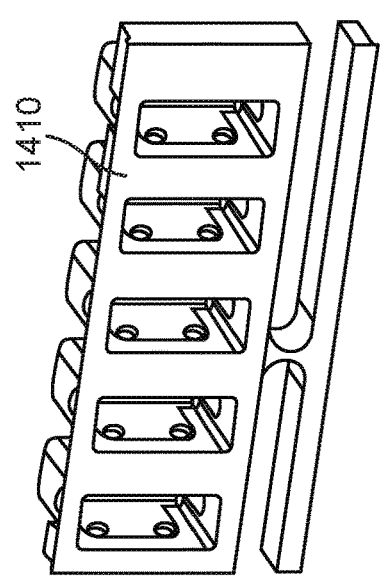
Figure 14C:
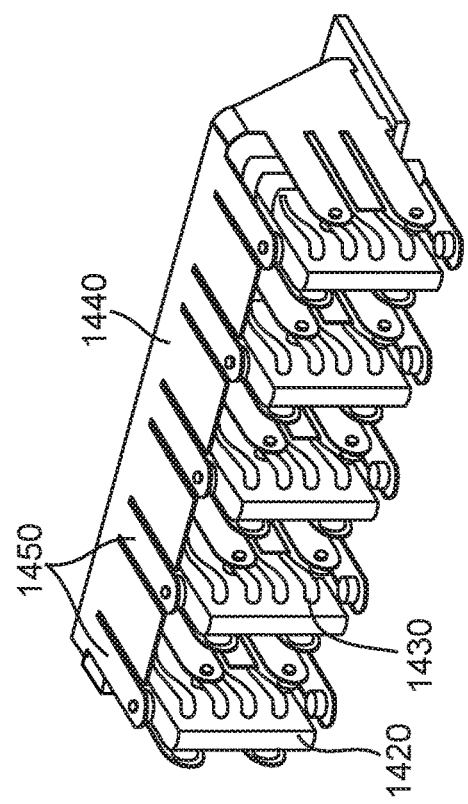

FIGS. 14A-14D illustrate a number of connector receptacles according to an embodiment of the present invention at various times during a manufacturing process. In FIG. 14A, a number of connector receptacle housings 1410 may be manufactured as a unit. This unit may be manufactured separately or as part of a device enclosure (not shown.) FIG. 14B illustrates an assembly including a number of tongues 1420 and contacts 1430. In FIG. 14C, tongue 1420 and contact assembly 1430 are covered with a frame 1440 having a number of fingers 1450. In FIG. 14D, this assembly is attached to the number of connector receptacle housings 1410.

Figure 15A:
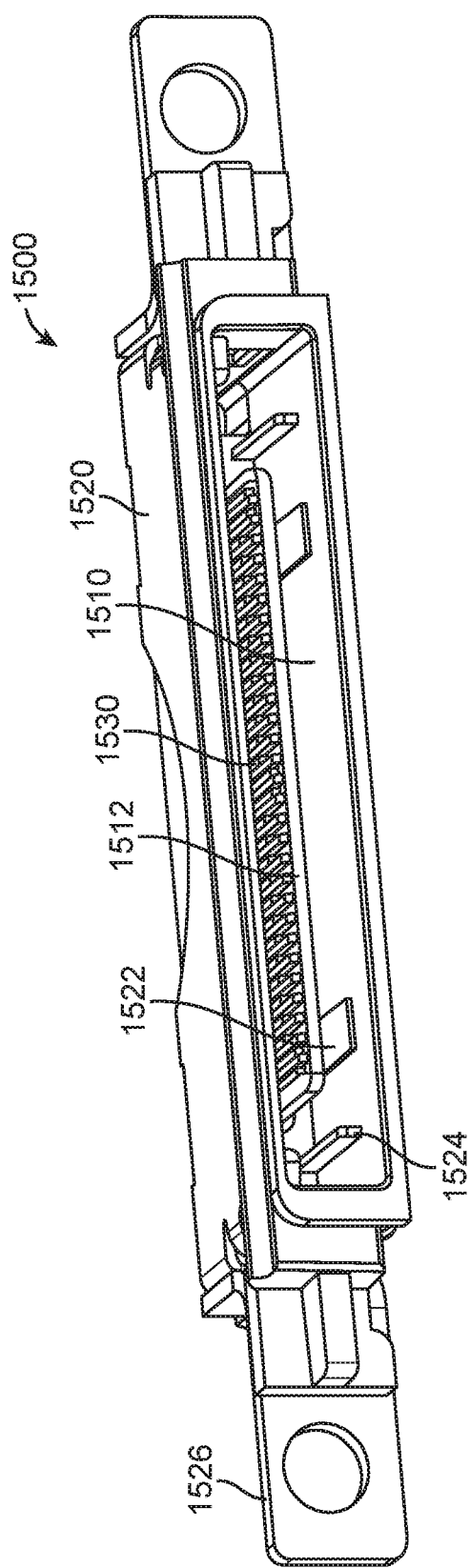
FIGS. 15A-15D illustrate a connector receptacle according to an embodiment of the present invention at various times during a manufacturing process.

FIGS. 15A-15D illustrate a connector receptacle according to an embodiment of the present invention at various times during a manufacturing process. FIG. 15A illustrates a connector receptacle according to an embodiment of the present invention. Connector receptacle 1500 may include housing 1510 and frame 1520. Housing 1510 may further include tongue 1512. Contacts 1530 may reside on tongue 1512. Ground tabs 1522 and keys 1524 may also be included. Bracket 1526 may be attached to frame 1520 to provide a mechanical connection to a device enclosure.

Again, it is desirable in some circumstances to provide a connector receptacle having a reduced height. This may allow an electronic device to be thinner and otherwise save space. Accordingly, embodiments the present invention may provide connector receptacles having a housing where one or more sides have been omitted. In this specific example, a top portion of housing 1510 has been omitted. In this way, the omission of the housing portion may not be immediately noticeable to a user. This allows the height of connector receptacle 1500 to be reduced, while a pleasing aesthetic appearance is maintained.

Figure 15B:
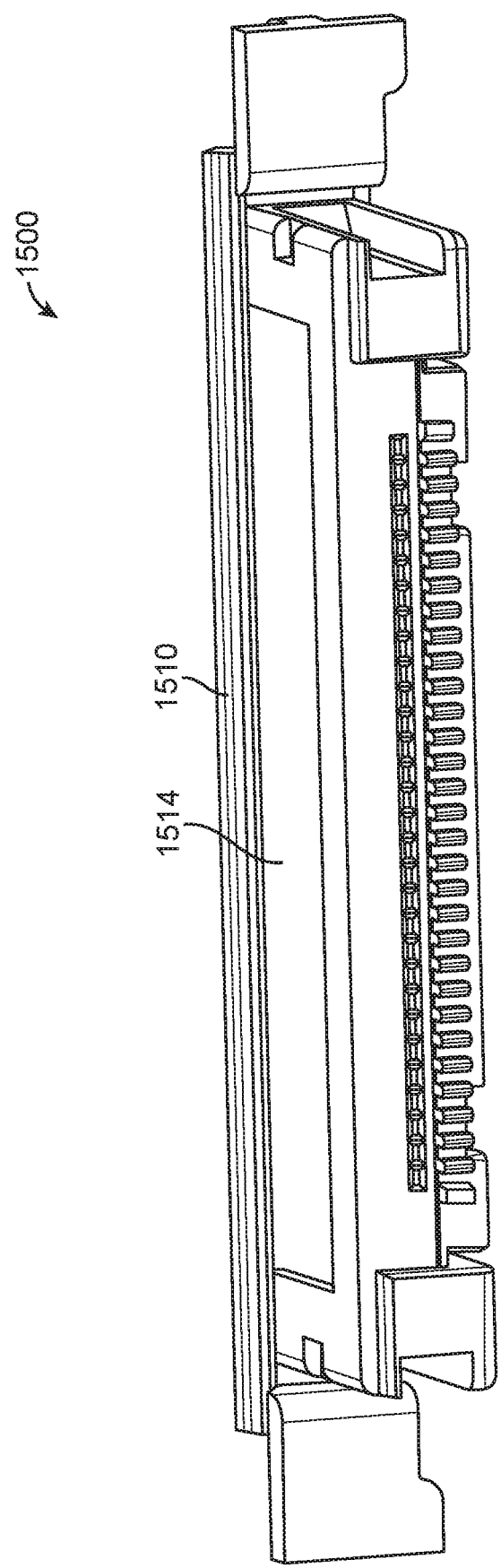

FIG. 15B illustrates a housing for a receptacle according to an embodiment of the present invention. In this figure, housing 1510 of connector receptacle 1500 may have an open area 1514 where a top of housing 1510 is absent or omitted. In other embodiments of the present invention, other portions of the housing, such as the bottom of the housing, may be omitted.

Figure 15C:
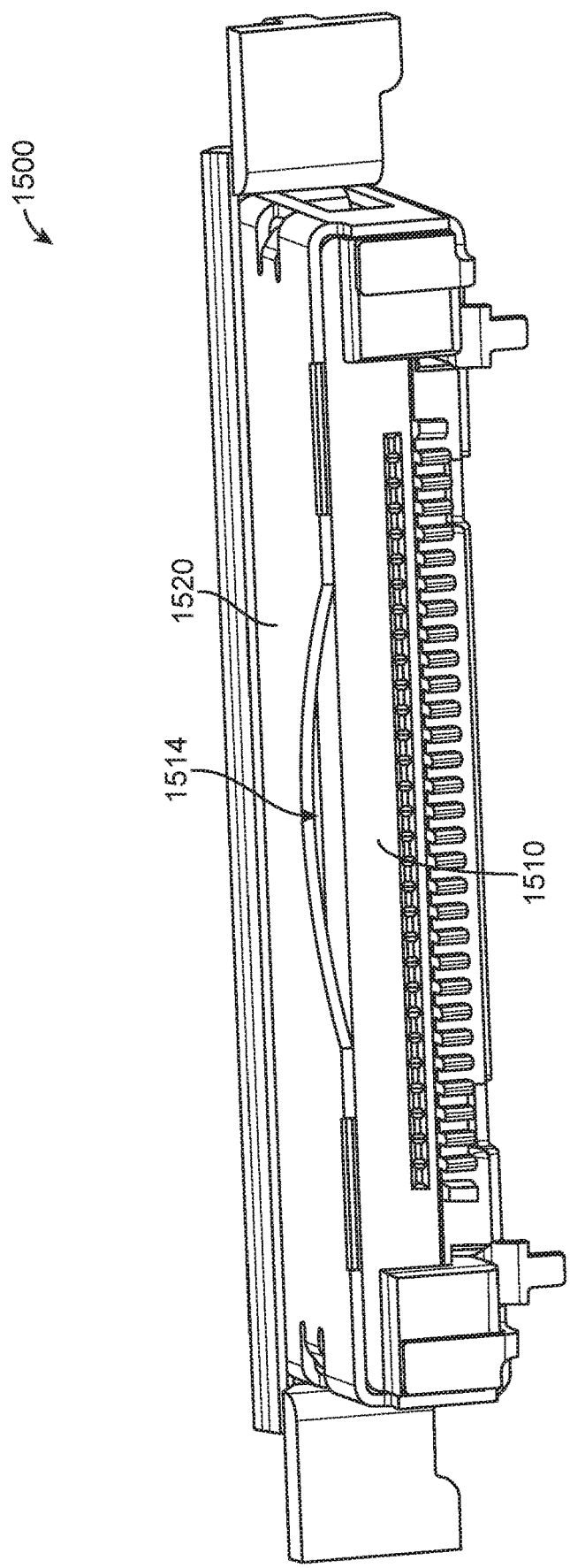
Figure 15D:
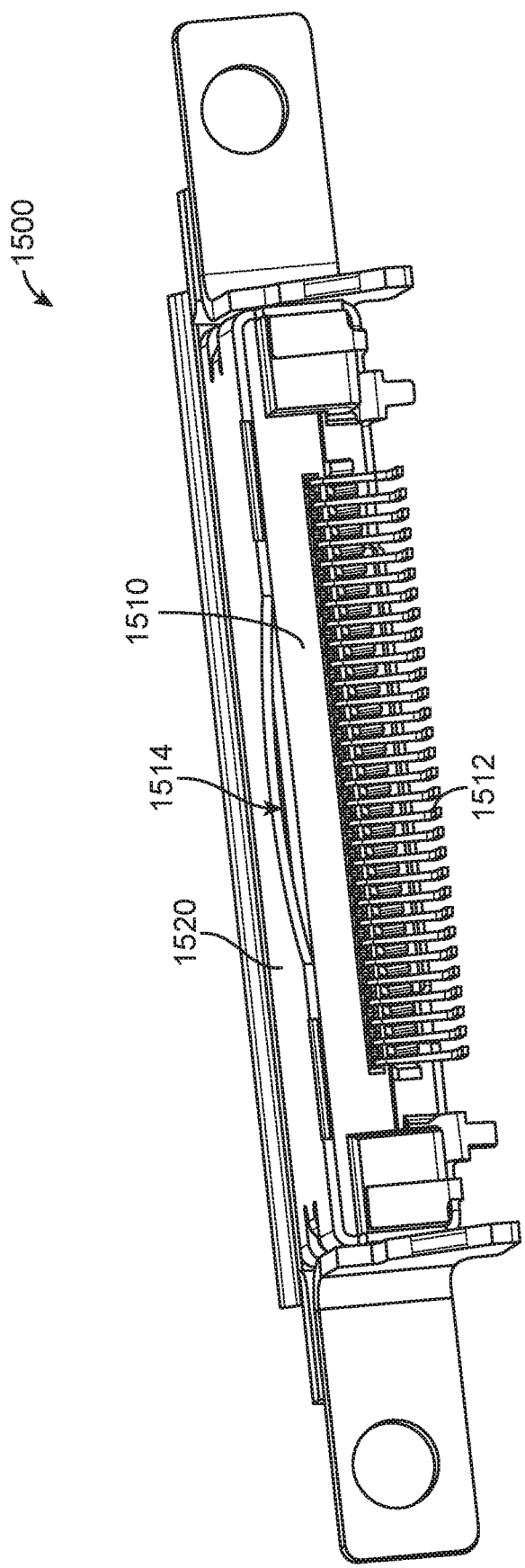

In FIG. 15C, frame 1520 is attached to a back of housing 1510. In FIG. 15D, contacts 1512 are inserted into housing 1510. In this embodiment of the present invention, contacts 1512 are surface mount contacts, though in other embodiments of the present invention, they may be through-hole contacts or other types of contacts.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
    a device enclosure to house electronic components of the electronic device;
    a receptacle connector having an opening at an exterior surface of the device enclosure sized and shaped to accept a corresponding connector, the receptacle connector having a recess comprising:
        a bottom surface;
        a sidewall portion defining the opening and integrally formed with the device enclosure, the sidewall portion extending from the exterior surface of the device enclosure into the electronic device to the bottom surface; and
        a tongue extending from the bottom surface, the tongue integrally formed with the bottom surface; and
    a plurality of contacts located in the recess.

2. The electronic device of claim 1 wherein the plurality of contacts are located on the tongue.

3. The electronic device of claim 1 wherein the bottom surface is integrally formed with the device enclosure.

4. The electronic device of claim 1 wherein the contacts are formed of one of the group consisting of aluminum, steel, stainless steel, spring steel, and palladium-nickel alloy.

5. The electronic device of claim 4 wherein the device enclosure is formed of one of the group consisting of plastic, ceramic, and aluminum.

6. An electronic device comprising:
a device enclosure to house electronic components of the electronic device; and
a receptacle connector having an opening at an exterior surface of the device enclosure sized and shaped to accept a corresponding plug connector, the receptacle connector comprising:
a recess comprising:
a bottom surface;
a sidewall portion defining the opening and integrally formed with the device enclosure, the sidewall portion extending from the exterior surface of the device enclosure into the electronic device to the bottom surface, the bottom surface integrally formed with the device enclosure and the sidewall portion;
a tongue located in the recess and extending from the bottom surface and integrally formed with the bottom surface; and
a plurality of contacts located on the tongue.

7. The electronic device of claim 6 wherein the electronic device is a cellular phone.

8. The electronic device of claim 6 wherein the electronic device is a portable computing device.

9. The electronic device of claim 6 wherein the contacts are formed of one of the group consisting of aluminum, steel, stainless steel, spring steel, and palladium-nickel alloy.

10. The electronic device of claim 9 wherein the device enclosure is formed of one of the group consisting of plastic, ceramic, and aluminum.

11. An electronic device comprising:
a device enclosure to house electronic components of the electronic device; and
a receptacle connector having an opening at an exterior surface of the device enclosure sized and shaped to accept a corresponding plug connector, the receptacle connector comprising:
a bottom surface;
a front sidewall portion defining the opening, the front sidewall portion extending from the exterior surface of the device enclosure into the electronic device;
a rear sidewall portion extending from the front sidewall portion to the bottom surface, the front sidewall portion integrally formed with the device enclosure, the front sidewall portion, rear sidewall portion, and bottom surface forming a recess;
a tongue extending from the bottom surface; and
a plurality of contacts located on the tongue.

12. The electronic device of claim 11 wherein the tongue is formed with the device enclosure.

13. The electronic device of claim 11 wherein the tongue is formed separately from the device enclosure.

14. The electronic device of claim 11 wherein the rear sidewall portion is formed separately from the device enclosure.

15. The electronic device of claim 11 wherein the rear sidewall portion is integrally formed with the device enclosure.

16. The electronic device of claim 15 wherein the bottom surface is formed separately from the rear sidewall portion.

17. The electronic device of claim 15 wherein the bottom surface is integrally formed with the rear sidewall portion.

18. The electronic device of claim 11 wherein the contacts are formed of one of the group consisting of aluminum, steel, stainless steel, spring steel, and palladium-nickel alloy.

19. The electronic device of claim 18 wherein the device enclosure is formed of one of the group consisting of plastic, ceramic, and aluminum.

* * * * *